United States Patent [19]

Dick

[11] Patent Number: 5,309,354
[45] Date of Patent: May 3, 1994

[54] ELECTRON BEAM EXPOSURE METHOD

[75] Inventor: Gregory J. Dick, Wappingers Falls, N.Y.

[73] Assignee: International Business Machines Corporation, Armonk, N.Y.

[21] Appl. No.: 784,834

[22] Filed: Oct. 30, 1991

[51] Int. Cl.⁵ .............................................. G06F 15/46
[52] U.S. Cl. .......................... 364/167.01; 250/492.22; 250/492.3; 364/491
[58] Field of Search ........................... 364/167.01, 491; 250/492.3, 492.22

[56] References Cited

U.S. PATENT DOCUMENTS

| | | | |
|---|---|---|---|
| 4,099,062 | 7/1978 | Kitcher | 250/492 A |
| 4,259,724 | 3/1981 | Sugiyama | 364/491 |
| 4,377,849 | 3/1983 | Finger et al. | 364/491 |
| 4,386,403 | 5/1983 | Hsieh et al. | 364/491 |
| 4,494,004 | 1/1985 | Mauer, IV et al. | 250/492 A |
| 4,500,789 | 2/1985 | Ban et al. | 250/492.2 |
| 4,507,738 | 3/1985 | Nozawa et al. | 364/474 |
| 4,523,098 | 6/1985 | Noma | 250/492.2 |
| 4,538,232 | 8/1985 | Koyama | 364/491 |
| 4,587,608 | 5/1986 | Kishi et al. | 364/191 |
| 4,728,799 | 3/1988 | Gordon et al. | 250/492.2 |
| 4,816,692 | 3/1989 | Rudert, Jr. | 250/492.22 |
| 4,827,423 | 5/1989 | Beasley et al. | 364/468 |
| 4,835,700 | 5/1989 | Tanaka et al. | 364/474.23 |
| 4,974,175 | 11/1990 | Suzuki et al. | 364/491 |
| 4,989,156 | 1/1991 | Ikenaga | 364/488 |

Primary Examiner—Joseph Ruggiero
Assistant Examiner—Paul Gordon
Attorney, Agent, or Firm—Charles W. Peterson, Jr.

[57] ABSTRACT

A more efficient method of macro placement and graying for electron beam (e-beam) lithography. The e-beam field is divided into smaller subfields. Repetitious shapes or collections of shapes which are repetitious are represented by macros. Some shapes span or are intersected by subfield boundaries. After the shapes are converted to fill rectangles and the fill rectangles are proximity corrected, the macro containing the proximity corrected fill rectangles is grayed and placed without being unnested. First, the Macro Organization Step, the macro's fill rectangles are sorted. Tall-narrow macros are sorted top to bottom then left to right, short-wide macros are sorted left to right then top to bottom. After the sort, chains of rectangles are created and a shadow is generated for the macro and for each chain. Next, the Macro Placement and Graying Step, a determination is made of whether and where macro graying will be required. The macro shadow is transformed into subfield coordinates and a determination is made of whether the transformed shadow intersects with (spans) a subfield boundary. If the macro's shadow touches more than one subfield (spans a subfield boundary), then the macro's chain shadows are examined to determine if any chain spans the boundary. Graying is done on any spanning chain. Gray-spliced rectangles and single rectangles are placed in the pattern buffer. Partial macro read commands are placed in the pattern buffer for chains or partial chains resulting from gray-splicing.

27 Claims, 14 Drawing Sheets

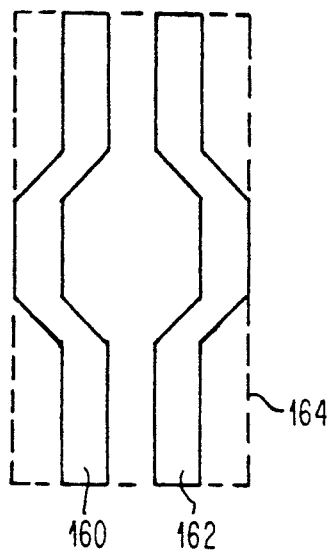
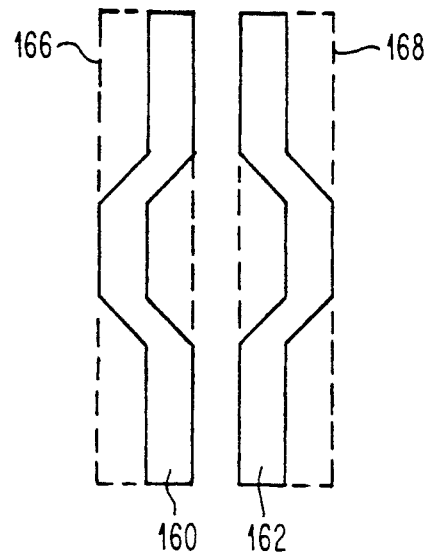
FIG. 3A    FIG. 3B
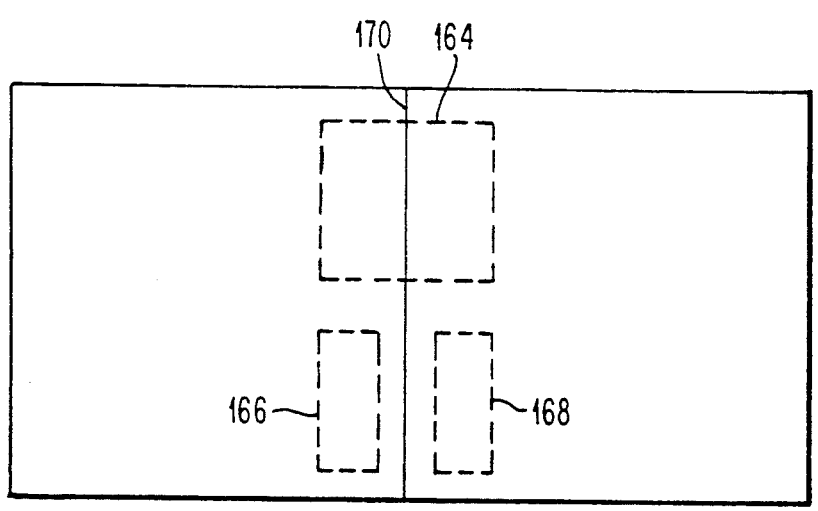
FIG. 3C

| MIRROR | ANGLE | RESULT | MIRROR | ANGLE | RESULT |
|--------|-------|--------|--------|-------|--------|
| NO | 0 | F | YES | 0 | Ⅎ |
| NO | 90 | ⊢ | YES | 90 | ⊣ |
| NO | 180 | ⅃ | YES | 180 | F |
| NO | 270 | ⊤ | YES | 270 | ⊥ |
FIG. 4A
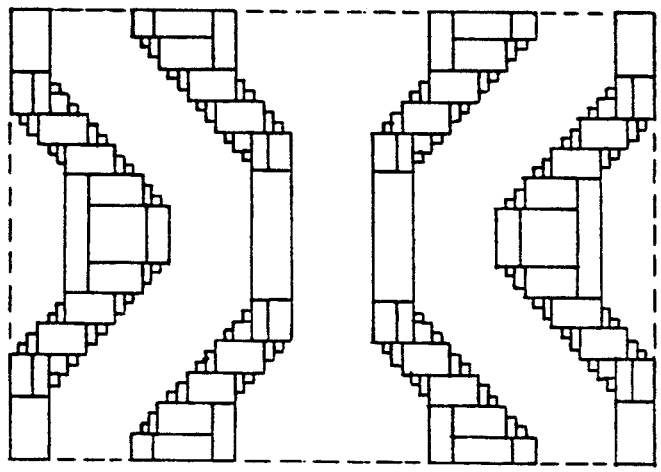
FIG. 4B
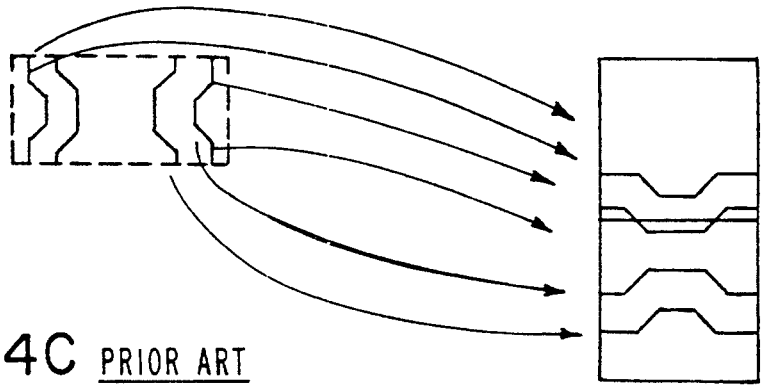
FIG. 4C  PRIOR ART
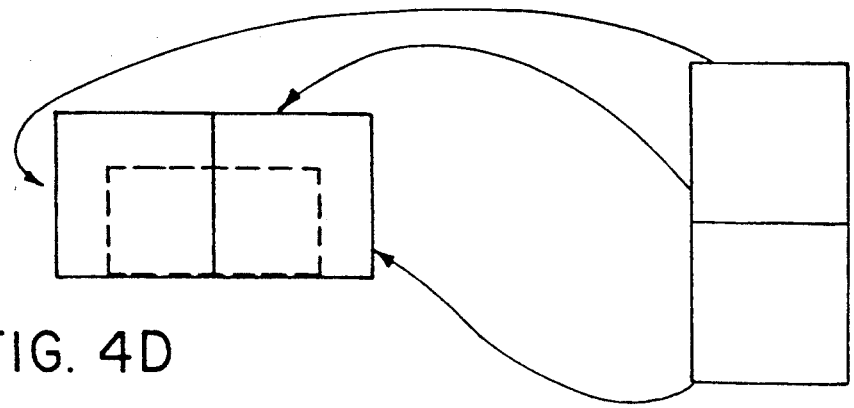
FIG. 4D

| SUBFIELD PAIRS | R1 | R2 | R3 | R4 | R5 | R6 | R7 | R8 |
|---|---|---|---|---|---|---|---|---|
| A/C | N | N | N | N | N | N | N | N |
| B/D | N | N | N | N | N | N | N | N |
| A/B | N | N | N | N | N | N | N | N |
| C/D | N | N | N | N | N | N | N | N |

FIG. 17B

| SUBFIELD PAIRS | R1 | R2 | R3 | R4 | R5 | R6 | R7 | R8 |
|---|---|---|---|---|---|---|---|---|
| A/C | F | F | N | N | T | N | T | N |
| B/D | D | D | F | F | D | T | D | T |
| A/B | D | D | D | D | D | D | D | D |
| C/D | D | D | D | D | D | D | D | D |

FIG. 17C

| SUBFIELD PAIRS | R1 | R2 | R3 | R4 | R5 | R6 | R7 | R8 |
|---|---|---|---|---|---|---|---|---|
| E/G | T | E | E | N | T | N | T | T |
| F/H | D | D | D | T | D | T | D | D |
| E/F | D | D | D | D | D | D | D | D |
| G/H | D | D | D | D | D | D | D | D |

FIG. 17D

ELECTRON BEAM EXPOSURE METHOD

DESCRIPTION

1. Field of the Invention

The present invention relates generally to the fabrication of integrated circuits and more particularly to a system and method of lithographic patterning of radiation sensitive layers by an electron beam exposure system.

2. Background of the Invention

Integrated circuit shapes can be patterned on a wafer entirely by means of direct writing electron beam (e-beam) lithography. Using e-beam to write microcircuit patterns in integrated circuit fabrication is well known in the art. The intended pattern can be directly written onto the wafer by exposing a thin layer of radiation sensitive material on the wafer with a beam of electrons or, alternatively, by using a mask made with an e-beam tool to optically expose a thin layer of photoresist on the semiconductor wafer. Whether the pattern is directly written or indirectly written with a mask, the e-beam tool control remains the same. See generally, U.S. Pat. No. 4,494,004 to Mauer, IV, et al. and assigned to the assignee of the present invention, for an example of a direct writing e-beam lithography method and apparatus used to expose to an entire semiconductor wafer. Using a computer to control the e-beam as disclosed in Mauer, IV, et al., is also well known.

While e-beam lithography provides the advantage of very sharply defined patterns for very small geometric shapes, transferring those shapes from a computer designed shape to a physical image on a photoresistive, or radiation sensitive layer (resist), can be both expensive and time consuming. Most of the cost associated with transferring the shape is computer operating cost, which is also generally time dependent. Therefore, reducing computer operating time will reduce both the time and the expense associated with e-beam lithography.

Typically, an e-beam tool writes only one specific type of shape such as a rectangle. So, in order to print design shapes into the resist which are more complex than rectangles, the e-beam tool prints a series of contiguous rectangles of various sizes. The pattern formed by these printed rectangles matches or closely approximates the design shape. The size and placement of these printed rectangles are generated from design shapes in a process called the "fill", so called because it appears that the rectangles have filled the shape. The rectangles generated in the fill are called fill rectangles.

Although fill rectangles generated in the fill supply size and placement information to control the e-beam tool, they do not provide exposure information known as proximity correction values. A proximity correction value is an adjustment to the duration of exposure, i.e., the amount of time the e-beam tool exposes the resist. Proximity correction is the step where a correction value is calculated for the interference in printing a rectangle which is caused by exposing the rectangle's neighbors (those in sufficiently close proximity to the rectangle). That effect, called the proximity effect, essentially, is to partially expose the resist around the exposed rectangle. If a proximity correction were not done on all of the fill rectangles in the design, then some of the rectangles would be over-exposed. Over-exposure causes loss of shape definition so that instead of printing a rectangle, a round spot might be printed.

Once a design has been filled and proximity corrected, it must be fragmented into sub-fields and these sub-fields must be individually written. Each subfield is no larger than the maximum e-beam tool's beam deflection range. Any shapes along the boundary between sub-fields are split at the boundary and then spliced back together by overlapping them along the boundary. Splicing shapes along the subfield boundaries is necessary because misalignment usually occurs along the boundaries. Splicing is done on the shapes' fill rectangles. So, fill rectangles which extend beyond the overlap must be divided into two overlapping fill rectangles. A prior art splicing method is disclosed in U.S. Pat. No. 4,816,692 to Rudert, Jr., incorporated herein by reference. As disclosed in Rudert, Jr., the overlapping portion of the two overlapping rectangles receive approximately half of the exposure (actually slightly more than half) so that the overlapped portion of the fill rectangle receives an exposure duration which is roughly equivalent to a full dose. The overlap area of each of the two overlap rectangles is said to be "greyed" or "grayed". Splicing two portions of a rectangle to write a single rectangle as described above is called "grey-splicing" or "gray-splicing". These two spellings are used in the art to refer to the same method and are not intended to refer to two different or alternative methods.

While gray-splicing allowed two adjacent subfields to be exposed sequentially, even though some of the shapes were shared by both subfields and so, crossed the subfield boundaries, gray-splicing increased data volume. This result was contrary to an e-beam system objective of reducing data volume. A prior art approach to reducing data volume has been to add a data compaction subsystem, called the "macro buffer" to the e-beam system.

The e-beam tool's macro buffer is a portion of the e-beam tool's storage used to store a repetitive series of commands called a "User Defined Macro" (UDM). Any time the e-beam tool was to expose a repetitive pattern, the control for the repetitive pattern, which was stored in the macro buffer as an UDM, was retrieved and provided control to the tool in exposing the desired pattern. The control was a series of commands generated from the proximity corrected fill rectangles and was called Numerical Control (NC) data. Since identifying repetitive patterns was left to the shape designers (users), the repetitive NC data (macros) was defined by the tool's users.

NC data not stored in the macro buffer is left in the e-beam tool's main storage, called its pattern buffer. Typically, a UDM contains the NC data for a highly repetitive array cell, such as, for example, a Random Access Memory (RAM) cell. Thus, instead of storing all of the proximity corrected fill rectangles for a single cell at every occurrence of the cell in the pattern buffer, a single command called a macro read command is stored at each occurrence. The macro read command contains the location of the macro in the macro buffer (the address) and the size of the macro. So, a single macro read command may replace what might be a large portion of NC data at every occurrence of the macro in the pattern buffer. If, for example, the macro is a RAM cell on a 1 Mbit RAM chip which has over one million RAM cells, then, whatever data volume saving realized by using a macro read command for the cell, is realized in excess of one million times. If the macro contains 1000 more bytes of information than a macro read command, then in excess of one billion bytes of storage would be saved.

Some of the data compaction achieved through the macro buffer is lost when a macro is gray-spliced. Grey-splicing is done after the design is filled and proximity corrected. If a macro crosses a sub-field boundary, then fill rectangles crossing or spanning the sub-field boundary must be greyed. However, a single shape or group of shapes may be used numerous times in a design so that the placement of the shape crosses several sub-field boundaries and, therefore, the macro for the shape or group of shapes requires different greying at each boundary. Usually a macro will not cross all of the boundaries identically. So, a single macro may require unique greying at each boundary crossing, thus impacting the macro's repetitiveness.

Prior art solutions for this problem failed to address this loss of repetitiveness. These prior art solutions included unnesting the macro occurrences falling on the sub-field boundaries; and, alternatively greying every fill rectangle in the macro. The first approach increased the data stored or handled in the pattern buffer. Pattern buffer data volume increased because occurrences of macro read commands in the pattern are replaced by the NC data for the grey-spliced macro. These macro occurrences were unnested regardless of whether shapes required grey-splicing or not. Occurrences which did not contain individual shapes requiring gray-splicing were still unnested whenever some of the macro's shapes resided in more than 1 subfield. Since he e-beam tool could only expose the area within one subfield at a time, shapes in a subsequent subfield would not be exposed from a macro read command which was executed in a current subfield and vice versa. Thus it was necessary to unnest spanning macros and place the unnested shapes, i.e. the proximity-corrected, gray'ed fill rectangles for the shapes, in the pattern buffer data for the subfield in which each shape lay.

The second approach, greying every fill rectangle in the macro, had three adverse effects. First, macro size expanded because, every fill rectangle was fragmented into small fill rectangles no larger than the overlap. Consequently, fewer UDMs could be placed in a fixed size macro buffer. Second, Macro shape image quality suffered because the exposure level for gray'ed areas is slightly more than 50%. Therefore, every fill rectangle in the macro was over-exposed. Also impacting image quality, graying, very often, occurred close to an edge of the overlap region. Third, this approach slowed the e-beam tool down because it increased the number of commands the tool had to execute at every occurrence of every macro.

OBJECTS OF THE INVENTION

It is an object of the claimed invention to improve semiconductor chip fabrication with a particle beam tool.

It is another object of the claimed invention to reduce computer processing time required for fabricating a semiconductor chip with a particle beam tool.

It is another object of this invention to more efficiently use macro space.

It is another object of this invention to minimize the unnested data used to control a particle beam tool.

It is another object of this invention to improve shape quality on large semiconductor chips.

It is another object of the invention to minimize shape graying.

It is another object of this invention to minimize shape graying, the unnested data created during shape graying and shape quality on semiconductor chips while reducing computer processing time and minimizing data volume required for semiconductor chip fabrication.

SUMMARY OF THE INVENTION

In accordance with the objects of this invention, a faster, more efficient method of macro placement and graying is provided wherein fill rectangles for ungrayed macro areas are retrieved from a macro buffer and fill rectangles for grayed areas are stored, unnested, in a pattern buffer. First, a macro is analyzed and organized to facilitate determining where greying will occur within the macro. In this macro organization step, the fill rectangles are sorted in the direction of the macro's largest dimension, contiguous fill rectangles are chained together and a shadow is created for each chain and for the macro. Second is the macro placement and greying step wherein the subfield boundaries on the chip are mapped onto the macro by transforming subfield coordinates into macro coordinates (called reverse transformation). With the subfield boundaries mapped into the macro, the fill rectangles that will be grey-spliced are identified. At every grayed occurrence of the macro, the macro read command is replaced in the pattern buffer in each subfield which the grayed macro resides with macro read commands pointing only to the NC data for the ungrayed portion of the macro in the subfield. Gray-spliced rectangles are then stored in the pattern buffer.

BRIEF DESCRIPTION OF THE DRAWINGS

While the specification concludes with claims particularly pointing out and distinctly claiming that which is regarded as the present invention, details of the preferred embodiments of the present invention may be more readily ascertained from the following technical description when read in conjunction with the following drawings wherein:

FIG. 3A is an example of a macro shadow.

FIG. 3B is an example of chain shadows.

FIG. 3C is an example of a macro placement spanning a subfield boundary.

FIG. 4A is a mirror rotation table for a "F"-shaped figure.

FIG. 4B is an example of a macro's shapes filled with fill rectangles.

FIG. 4C is a representation of the prior art method of transforming the macro's fill rectangles into subfield coordinates.

FIG. 4D is a representation of reverse transformation of the subfield into macro coordinates.

FIG. 17B-C are representations of an assignment table for one transform of a macro.

FIG. 17D is a representation of an assignment table for a second transform of the macro.

DETAILED DESCRIPTION OF THE PREFERRED EMBODIMENT

In the preferred embodiment of the present invention, macro nesting is maintained even on grayed macro occurrences. Instead, of unnesting grayed macros into the pattern buffer, only the grayed-filled rectangles along the subfield boundary are stored as unnested rectangles in the pattern buffer. Ungrayed portions of the macro are retrieved from the macro buffer, whenever a subfield containing part of the macro is written. Thus, by using as much of the information from the macro stored in the macro buffer as possible, data compaction is preserved and data volume expands insignificantly compared to data volume expansion caused by prior art macro greying techniques. The term "macro" is used interchangeably below to mean the NC data stored in the macro buffer, the fill rectangles from which the NC data was derived, and, the shapes from which the fill rectangles were generated and which are to be the ultimate results of the e-beam exposure. This is the ordinary usage of the term "macro" for a person of skill in the art. Therefore, a person of skill in the art would understand from the context of the usage, to what "macro" referred, e.g. filling the macro refers to filling the group of shapes from which the NC data is derived and graying the macro refers to gray-splicing the fill rectangles. In the preferred embodiment, first, a macro's proximity corrected fill rectangles are analyzed and organized for subsequent modification.

Macro Organization

Figure 1:
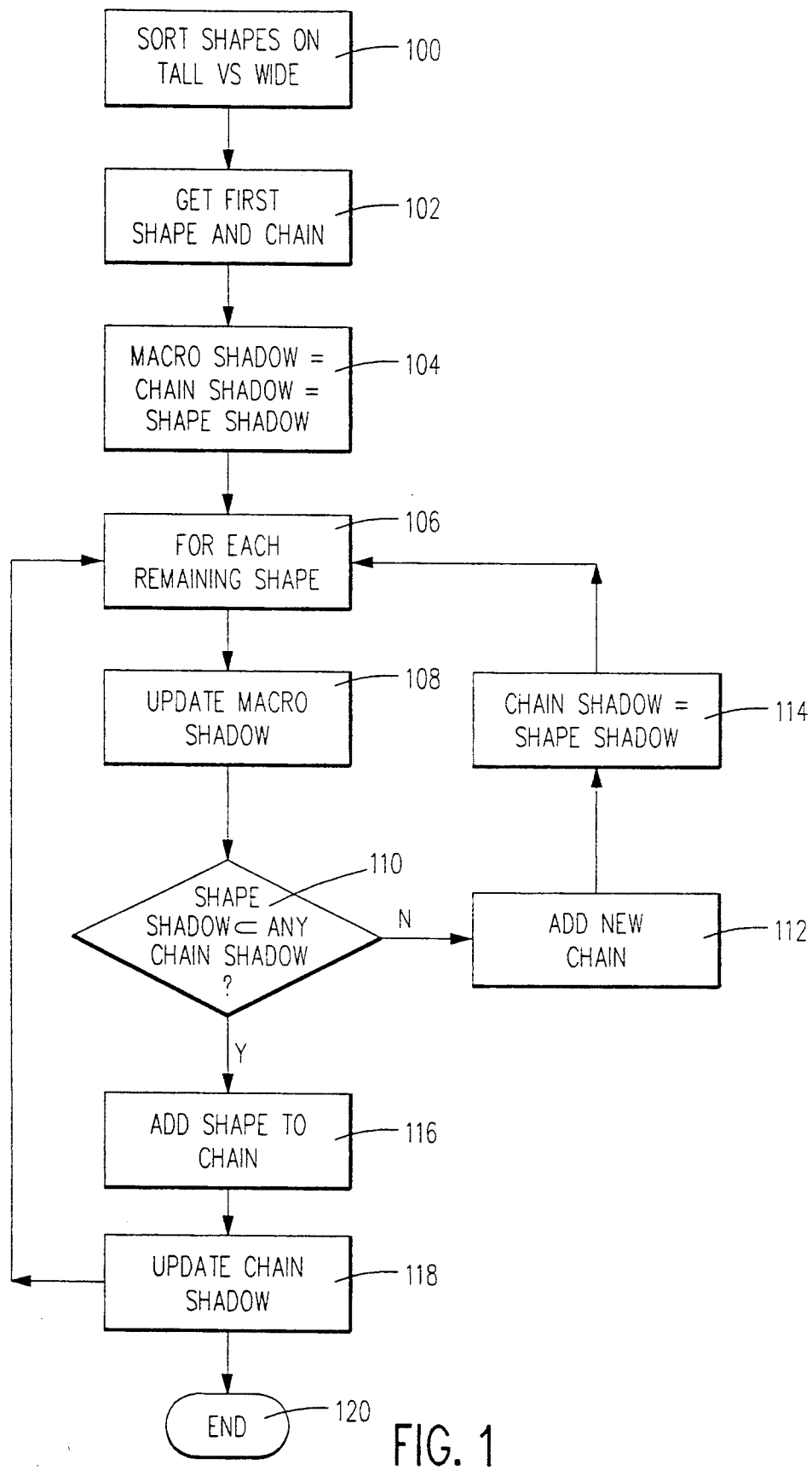
FIG. 1 is a flow diagram of the macro organization step of the preferred embodiment.
Figure 2A:
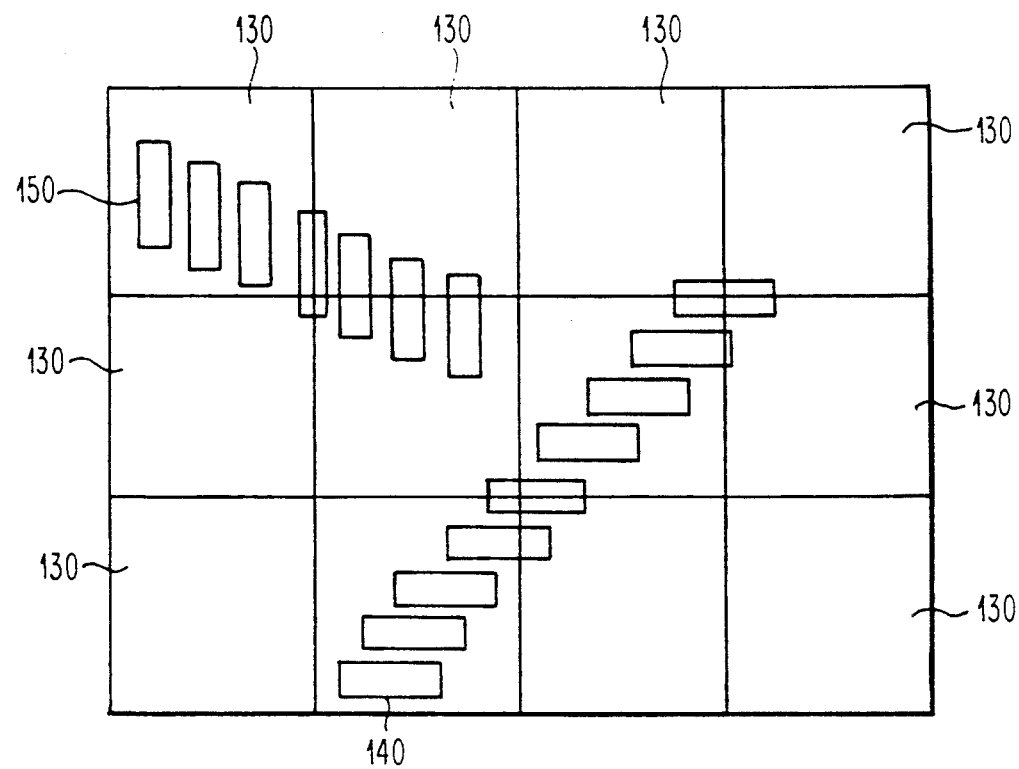
FIG. 2A is an example of macro placement.
Figure 2B:
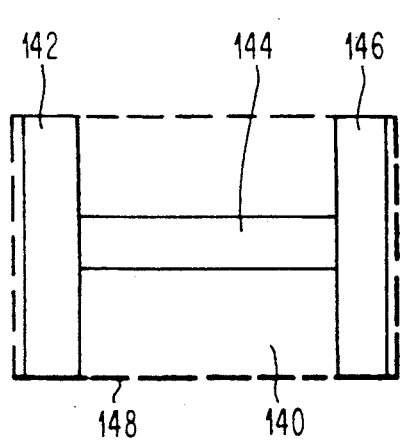
FIG. 2B is an example of wide macro rectangle ordering.
Figure 2C:
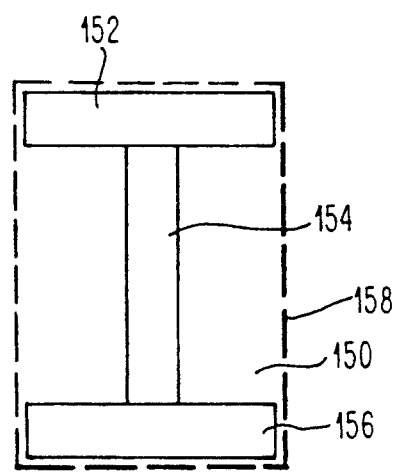
FIG. 2C is an example of tall macro sort ordering.

FIG. 1 is a flow diagram of this first major step of the preferred embodiment of the present invention which is called Macro Organization. In Macro Organization, the fill rectangles are organized in the order most likely to produce the largest number of contiguous fill rectangles should the macro be intersected (cut) by subfield boundaries e.g. 130 in FIG. 2A. Therefore, if the macro, which is two dimensional, has one dimension larger than the other, then the macro's fill rectangles are sorted according to each rectangles upper left vertex, first in the direction of the largest dimension, called the macro's major sort field and then in the direction of the smaller dimension, called the macro's minor sort field 100. So, fill rectangles for a macro which is wider than it is tall as depicted in FIG. 2B, are sorted left to right, the major sort field, and top to bottom, the minor sort field, i.e., fill rectangles having a common x-coordinate sort point are sorted in descending order according to each fill rectangles y-coordinate. However, a macro which is taller than it is wide, as depicted in FIG. 2C, has its fill rectangles sorted top to bottom, the major sort field, and left to right, the minor sort field, i.e., rectangles having a common y-coordinate sort point are sorted in the x direction in ascending order according to x- coordinate sort point. Thus sorting macro fill rectangles, yields a list of rectangles most likely to have the subfield boundary intersections grouped together within the list for most macro occurrences at subfield boundaries. So, if the list is fragmented by such intersections, the number of fragments likely to result is minimized. In other words, the list fragments produced are most likely to be maximized, i.e., have the largest number of contiguous rectangles. When a macro has equal height and width, either height or width may be selected as major subfield and minor subfield. In the preferred embodiment, when a macro's height and width are equal, width is chosen as the macro's major sort field and height as the macro's minor subfield.

As the fill rectangles are sorted 100, they are placed in a linked list structure. Since the macro's fill rectangles were placed in the linked list according to the location in the macro of the rectangle's upper left vertex, it is likely that fill rectangles for macro shapes will be scattered throughout the list, instead of in contiguous groups. So, a chain is created for each macro shape to link all of the fill rectangles for the shape together. Each of the macro shape's fill rectangles is linked to other of the shape's fill rectangles in the list forming a chain. So, for macro 140 in FIG. 2B, one chain would be created by linking together fill rectangles 142, 144 and 146 in that order, and for macro 150 in FIG. 2C a chain would be created by linking together fill rectangles 152, 154, and 156, in that order. Note that in FIG. 2A, tall narrow macro 150 is most frequently cut horizontally and short wide macro 140 is most frequently cut vertically. As each chain is built, the least enclosing window is determined for the chain being built and for the entire macro. The least enclosing window, known as the shadow, is the smallest rectangle which will completely enclose the chain (or macro), 148 in FIG. 2B and 158 in FIG. 2C.

Chaining fill rectangles together 102 to create chains, begins with the first fill rectangle in the list created in the sort 100. First, both the macro shadow and the chain shadow are initialized by being set equal to the first fill rectangle 104 from the list. After initializing both the macro shadow and the chain shadow 104, the remaining fill rectangles are added to the chain. Each remaining fill rectangle is sequentially added to the chain in its sorted order 106. However, before adding a fill rectangle to a chain, the macro shadow is expanded 108, if necessary, to enclose the fill rectangle. Next, the fill rectangle is checked to determine if it intersects a shadow of one of the chains already built 110. If the fill rectangle does not intersect with any of the existing chain's shadow, then a new chain is started 112 with the new chain's shadow being initialized to the fill rectangle 114. If, however, the fill rectangle intersects the shadow for one of the existing chains, then, the fill rectangle is added to that chain 116 and, that chain's shadow is expanded, if necessary, to enclose the added fill rectangle 118. If the fill rectangle intersects with two or more chain shadows, then a check is made to determine whether the fill rectangle connects two or more chains together. If the fill rectangle connects chains together than a single chain is formed from the connected chains and a single chain shadow is formed for the resulting single chain. Once every fill rectangle is chained, then the fill rectangles for each macro shape have been chained together, a shadow has been generated for each chain (shape) and for the macro, and macro organization is complete 120. FIG. 3A is an example of a pair of design shapes 160 and 162 and the macro shadow 164 created by organizing the macro for graying the fill rectangles for 162. FIG. 3B shows the same design shapes 160 and 162 with their corresponding chain shadows 166 and 168. FIG. 3C depicts macro shadow 164 spanning subfield boundary 170 with chain shadows 166 and 168 each lying completely in a subfield.

Once macro organization is completed as set forth above, the second and final major step called macro placement and graying, may be done. The macro placement and graying step involves determining each macro's placement and determining whether that macro will require graying.

Macro Placement and Graying

In prior art graying methods, grayed macros were unnested, thus transforming the macro fill rectangles into the subfield coordinates. However, unnesting the macros expands the data defeating the purpose of having macros and losing the advantage provided by nested processing. By contrast, the present invention, maintains nesting and its associated advantages by first transforming the subfield boundaries into macro coordinates and, then, unnesting only fill rectangles which are actually gray-spliced or which actually increase data volume.

To understand reverse transformation, first, macro transformation into subfield coordinates must be understood. Transformation involves three elements: placement; rotation; and mirroring. "Placement" is the translation or the location of a macro in the subfield. A macro is placed at a location by adding an offset value to the macro's origin and then adding the offset macro at the design field's origin, thus placing the macro within the field at the offset location. "Rotation" is that placed macro's rotation about its origin. In the preferred embodiment, macro rotation is limited to multiples of 90°, i.e., 0°, 90°, 180°, and 270°. "Mirroring" is the presence or absence of mirroring about the y axis, i.e., whether or not the macro or its mirror image was placed. Consequently, as demonstrated for an "F" shape in the table in FIG. 4A, where the "F" shape represents an unrotated-unmirrored shape, there are 8 unique transform cases which result from the four allowed rotations being combined with the two mirroring alternatives. Because a macro is transformed into the design's coordinates, each occurrence of a macro in the design is called a transform of the macro. Macro occurrences are called macro transforms. Transforming a macro into a subfield may require a significant amount of computer processing resources. For example, the macro of FIG. 4B has 168 fill rectangles filling 4 design shapes. If this macro were unnested, then, at every macro occurrence (transform), each of these fill rectangles would be placed, mirrored, and rotated, in accordance with the macro's placement rotation and mirroring see FIG. 4C.

Alternatively, as provided in the present invention, both data volume and computer processing resources can be minimized by transforming the boundaries of two subfields into macro coordinates, called Reverse Transformation. Reverse Transformation merely requires that the subfield's five boundaries be placed, mirrored and rotated into the macro's coordinates, see FIG. 4D. This reverse transformation of the subfield's boundaries into macro coordinates provides a way of predicting how graying will be required without unnesting the macro, thereby providing a significant advantage over the prior art.

However, before determining how graying will be required, first it must be determined if graying will be required. By transforming a macro's shadow into subfield coordinates, it can easily be determined whether a macro intersects a subfield boundary and, therefore, must be grayed. The particular transform on a macro is also the macro shadow's transform and so, determines in which subfield the macro resides. The macro's placement determines the macro shadow's location in a subfield. In conjunction with that placement, the macro's rotation and mirroring determine if, where, and how the macro shadow crosses a subfield boundary. Transforming the macro shadow, the same macro shadow generated in the macro organization step above, into subfield coordinates, determines which subfields the macro touches. If the transformed shadow only touches one subfield then the macro does not cross a subfield boundary and therefore does not require graying. If, however, the shadow touches more than one subfield, gray-splicing may be necessary and some of the macro's fill rectangles are in each of the subfields touched by the shadow. Reverse Transformation is done on every subfield touching the macro shadow whenever the shadow touches more than one subfield. Reverse Transformation is done in order to determine which macro fill rectangle must be gray-spliced and in which subfields the remaining (ungray-spliced) fill rectangles must be otherwise placed.

Figure 5A:
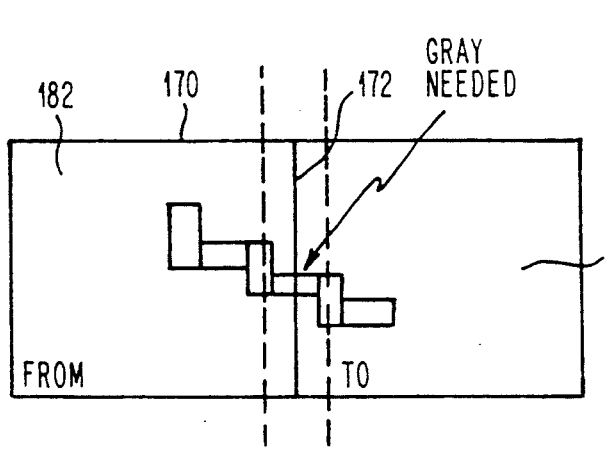
FIGS. 5A and 5B are representations of vertical and horizontal "From" and "To" subfields.
Figure 5B:
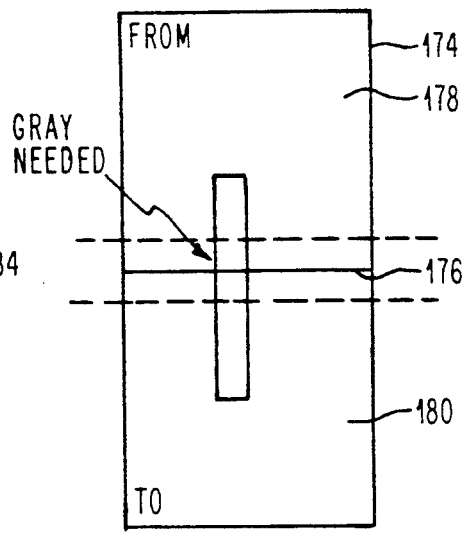
Figure 6:
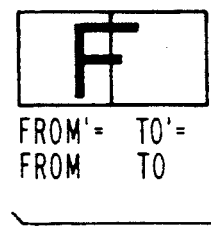
FIG. 6 is an example of reverse transformation of an "F"-shaped figure with no mirroring and at angle=0°.
Figure 7:
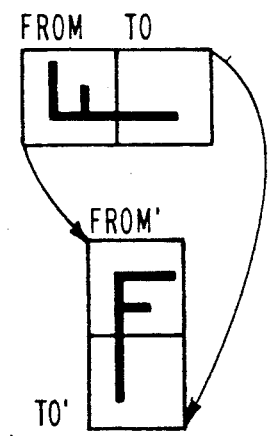
FIG. 7 is an example of reverse transformation of an "F"-shaped figure with no mirroring and at angle=90°.
Figure 7:
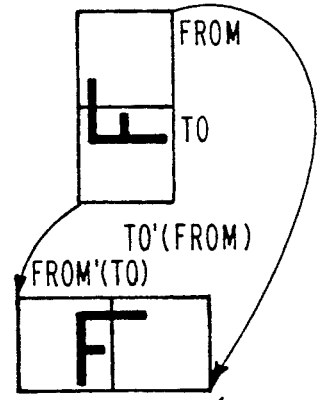
Figure 8:
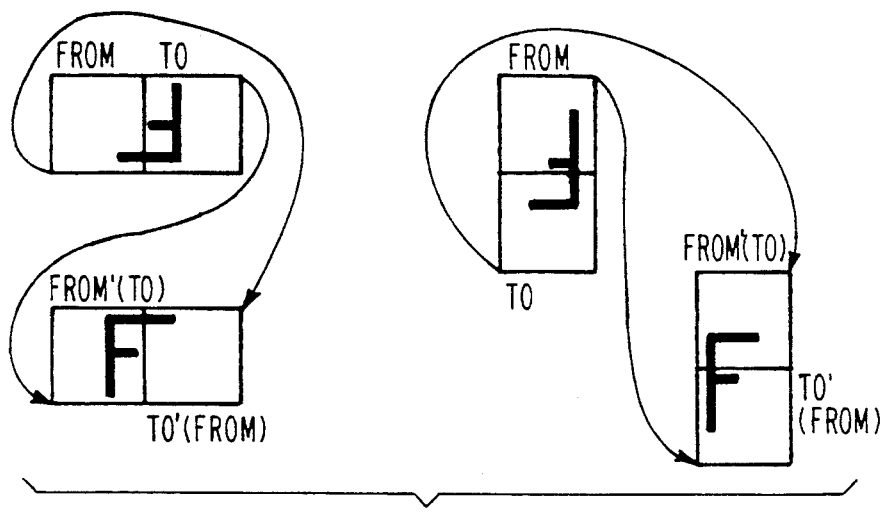
FIG. 8 is an example of reverse transformation of an "F"-shaped figure with no mirroring and at angle=180°.
Figure 9:
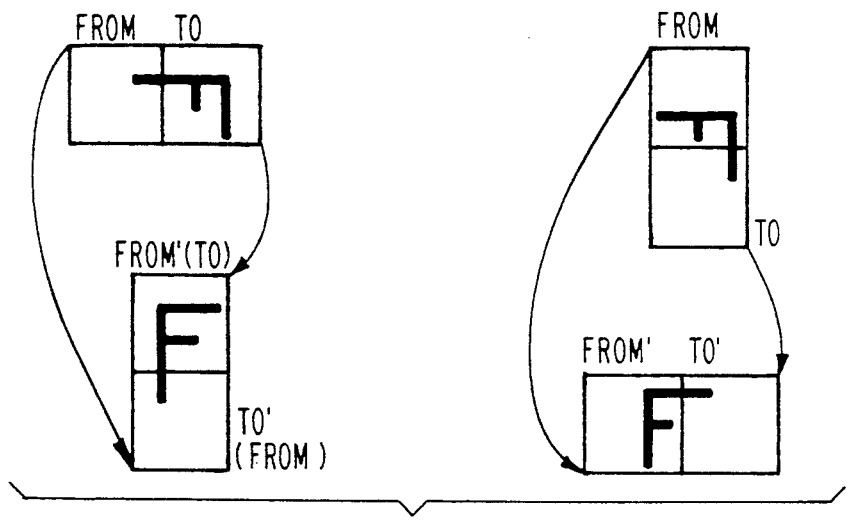
FIG. 9 is an example of reverse transformation of an "F"-shaped figure with no mirroring and at angle - 270°.
Figure 10:
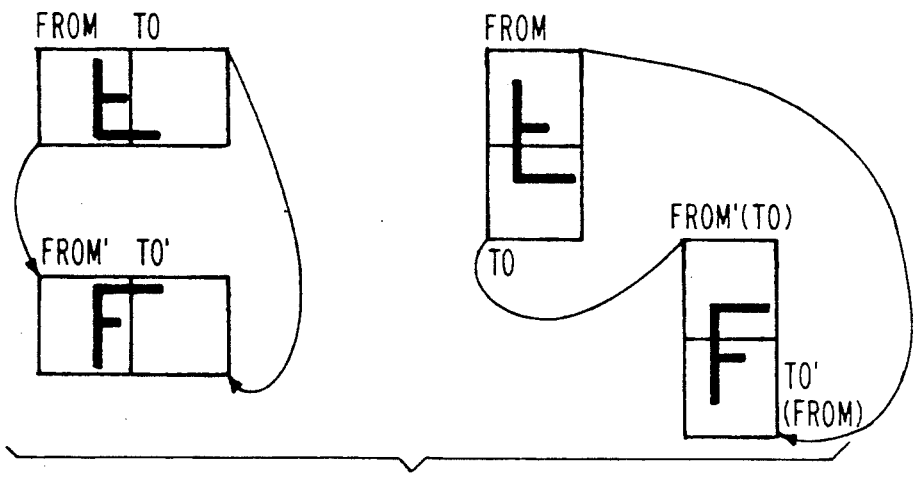
FIG. 10 is an example of reverse transformation of an "F"-shaped figure with mirroring and at angle=0°.
Figure 11:
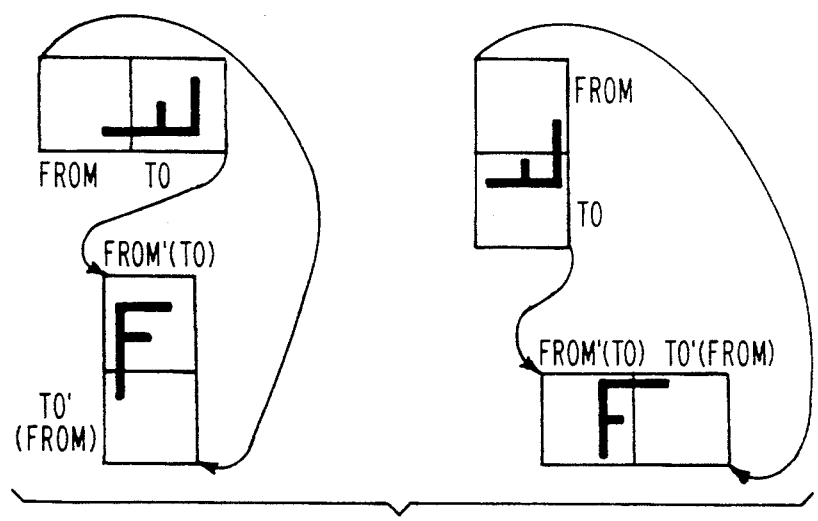
FIG. 11 is an example of reverse transformation of an "F"-shaped figure with mirroring and at angle=90°.
Figure 12:
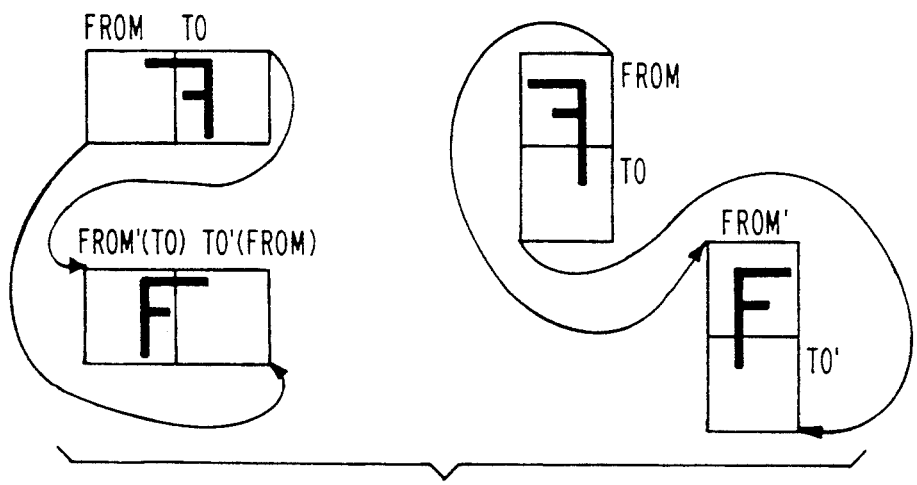
FIG. 12 is an example of reverse transformation of an "F"-shaped figure with mirroring and at angle=180°.
Figure 13:
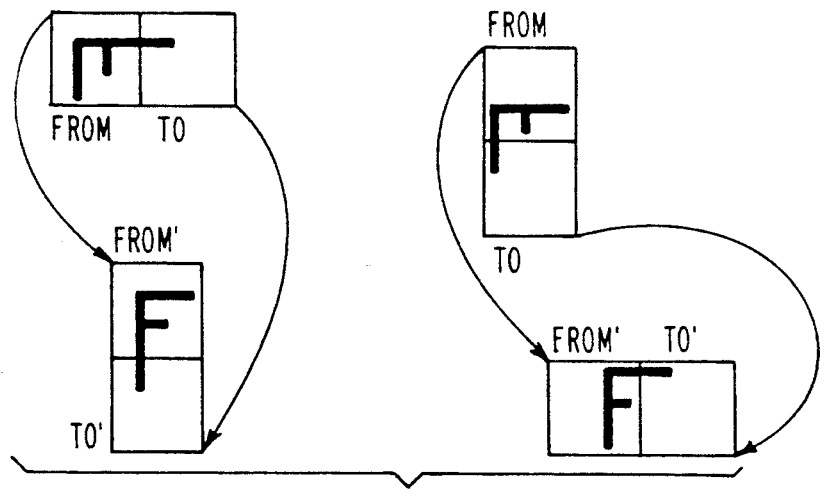
FIG. 13 is an example of reverse transformation of an "F"-shaped figure with mirroring and at angle=270°.

Since subfields are normally square, subfield pairs are normally rectangular and characterized as either horizontal 170 in FIG. 5A with a vertical shared boundary (172) or as vertical (174) in FIG. 5B with a horizontal shared boundary (176). One subfield is designated as the "From" subfield, with the other designated as the "To" subfield. In the preferred embodiment, the top subfield is designated as the "From" subfield (178) and the bottom subfield (180) is designated as the "To" subfield for a vertical subfield pair. For a horizontal subfield pair, the left subfield (182) designated as the "From" subfield and the right subfield (184) designated as the "To" subfield for the preferred embodiment. Graying is done for every chain crossing the subfield boundary as determined by whether the chain's shadow intersects the subfield boundary. Some or all of the fill rectangles may require gray-splicing. To determine which macro shapes require graying, all of the shadows for the macro's shapes are examined, starting from the "From" subfield, across the subfield boundaries, and into the adjacent "To" subfield. However, prior to determining which shapes must be qrayed, the subfield coordinates are transformed into macro coordinates.

The Reverse Transformation

As noted above, Reverse Transformation means mapping a pair of subfield's common boundary into macro coordinates. After the reverse transformation, the "From" and "To" subfields can be identified in the macro and the unmirrored, unrotated macro can be grayed. To transform the subfield pair into macro coordinates, the location of each of the subfield's sides must be identified in the macro's coordinate system. The Reverse Transformed subfield pair's top edge is located first by finding the subfield pair's boundary which is to the top of the transformed macro, i.e., above the transformed macro shadow's origin. The Reverse Transformed subfield pair's left edge is also located by finding the pair's boundary which is to the left of the transformed macro shadow's origin. By identifying the transformed subfield pair's top and left edges, the pair's right and bottom edges are, also identified. The Reverse Transformation of both vertical and horizontal subfield pairs onto a macro having an F shaped figure is shown in FIGS. 6-13 for each of the eight possible macro transforms listed in FIG. 4A. It is an intended result of reverse transformation, that the "From" and "To" fields of the subfield pair also be reverse transformed. So, the "From" subfield may be Reverse Transformed into the "To" subfield in macro coordinates and the "To" subfield Reverse Transformed into the "From" subfield in macro coordinates, i.e., "flipped". The relation between macro transformation and reverse transformation can be summarized as follows:

| M | A | Left' | Top' | Flip | FIG. |
|---|---|---|---|---|---|
| 0 | 0° | From Left - Tx | From Top - Ty | N | 6 |
| 0 | 90° | To Bottom - Ty | Tx - From Left | V | 7 |
| 0 | 180° | Tx - To Right | Ty - To Bottom | B | 8 |
| 0 | 270° | Ty - From Top | To Right - Tx | H | 9 |
| 1 | 0° | From Left - Tx | Ty - To Bottom | V | 10 |
| 1 | 90° | To Bottom - Ty | To Right - Tx | B | 11 |
| 1 | 180° | Tx - To Right | From Top - Ty | H | 12 |
| 1 | 270° | Ty - From Top | Tx - From Left | N | 13 |

Where:

M indicates mirroring (0=no, 1- yes).

A is rotation angle in degrees.

Left' indicates the edge and "To" or "From" subfield location of the Reverse Transformed Left edge as transformed from subfields coordinates to the macro's coordinates.

Top' indicates the edge and subfield "To" or "From" location of the reverse transformed top edge as transformed from subfield coordinates to the macro's coordinates.

Tx is the x translation of the macro's origin in the subfield coordinates.

Ty is the y translation of the macro's origin in the subfield coordinates.

Flip indicates when the Reverse Transformed "To" and "From" subfields are flipped where:

N indicates never;

V indicates flipping for vertical subfield pairs;

H indicates flipping for horizontal subfield pairs; and

B indicates flipping for both horizontal and vertical subfield pairs.

FIG. indicates the corresponding figure number of an example Reverse Transformation of a macro with an "To" shaped figure for the given macro transform.

The result of Reverse Transformation is that the subfield boundaries are mapped into unmirrored, unrotated macro coordinates. Reverse Transformation allows placement and graying or gray processing to be completed without transforming all of the macro's fill rectangles into subfield coordinates.

Figure 14:
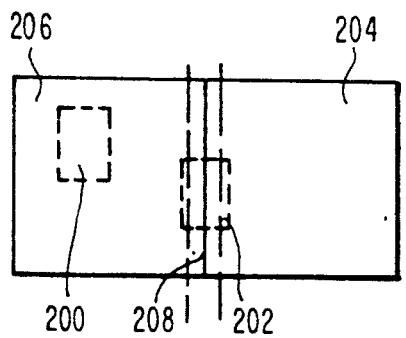
FIG. 14 is a representation of how a macro shadow is checked for crossing a subfield boundary.
Figure 15:
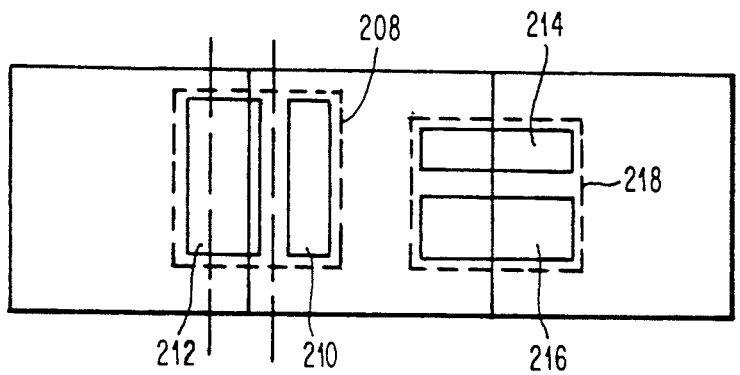
FIG. 15 is a representation of how a chain shadow is checked for crossing a subfield boundary.
Figure 16:
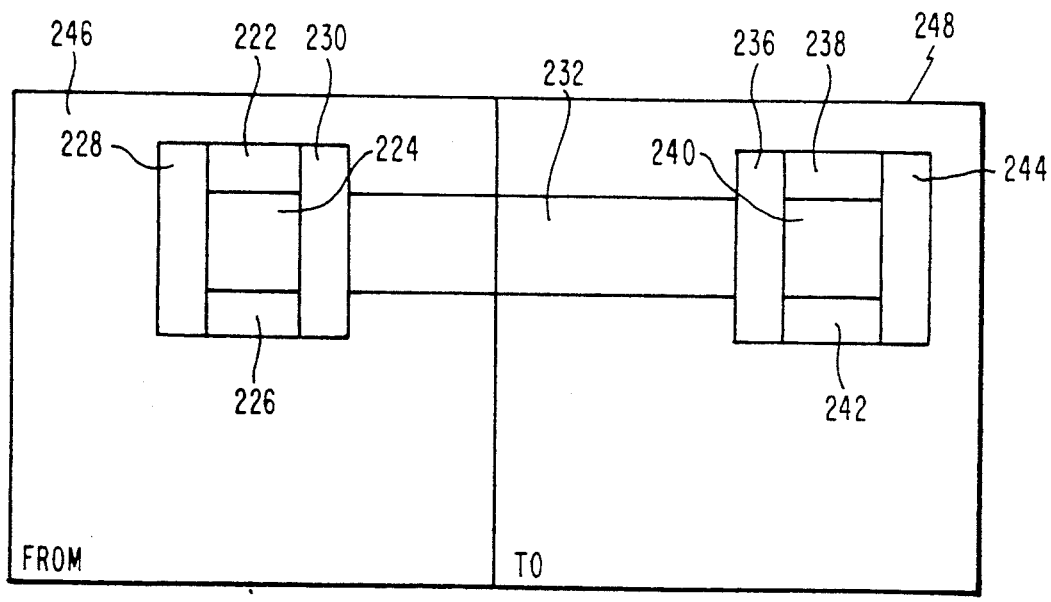
FIG. 16 is a representation of how a chain would be converted to macro read commands and greyed shapes.

FIGS. 14, 15 and 16 illustrate the three levels of checking in the gray-splicing method of the present invention. First, as illustrated in FIG. 14, the macro shadows (200 and 202) are transformed into subfield 204 and 206 coordinates. If the macro's shadow (200) does not cross subfield boundaries, then no further checking is done and a single macro read command is created for this macro transform. The subfield boundary has an overlap region 208 on both sides of it. The overlap region 208 is shared by and part of both subfields. Since a macro or shape which does not extend past the overlap region resides entirely in one subfield, to be a candidate for graying, a macro must extend beyond both subfields' overlap regions 208. When used below, it is to be understood that a macro shape or fill rectangle crosses or spans the subfield boundary, only if the spanning macro, shape, or rectangle, extends beyond both overlap regions 208.

If, however, the macro 202 crosses a boundary 208 then, the second check is made on chain shadows, as shown in FIG. 15. Any chain shadows 210 and 212 which do not cross subfield boundaries are marked as belonging to a single subfield. The third and final check is done only on chains with shadows 214 and 216 crossing the subfield boundary.

This final check uses the reverse transformation of the subfield boundary to determine placement and graying in the chain, see FIG. 16. Each fill rectangle is marked in a table (called the assignment table), as designated to reside in one of the two subfields 246 and 248. Fill rectangles 222-230, lie in subfield 246 and 236-244 in subfield 248. A unique set of gray-spliced rectangles is created for rectangle(s) 232 which must be grayed-spliced. This unique set of grey-spliced rectangles is placed in the pattern buffer. Also, since it would be inefficient to use a macro read command to retrieve NC data for single ungray-spliced rectangles which, after graying, were not part of a chain, these single rectangles are also placed into the pattern buffer.

Figure 17A:
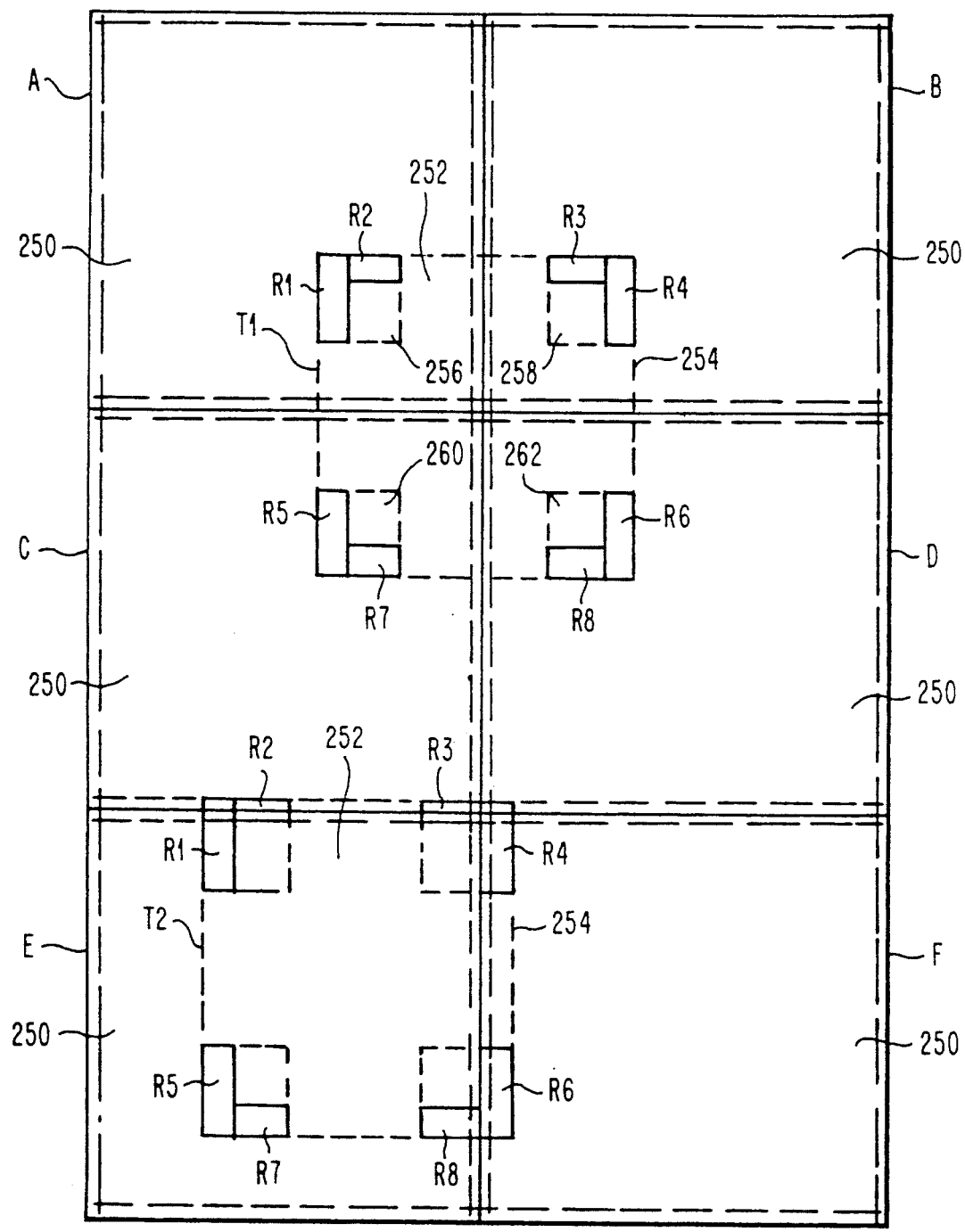
FIG. 17A is a representation of a group of 6 subfields.
Figure 18:
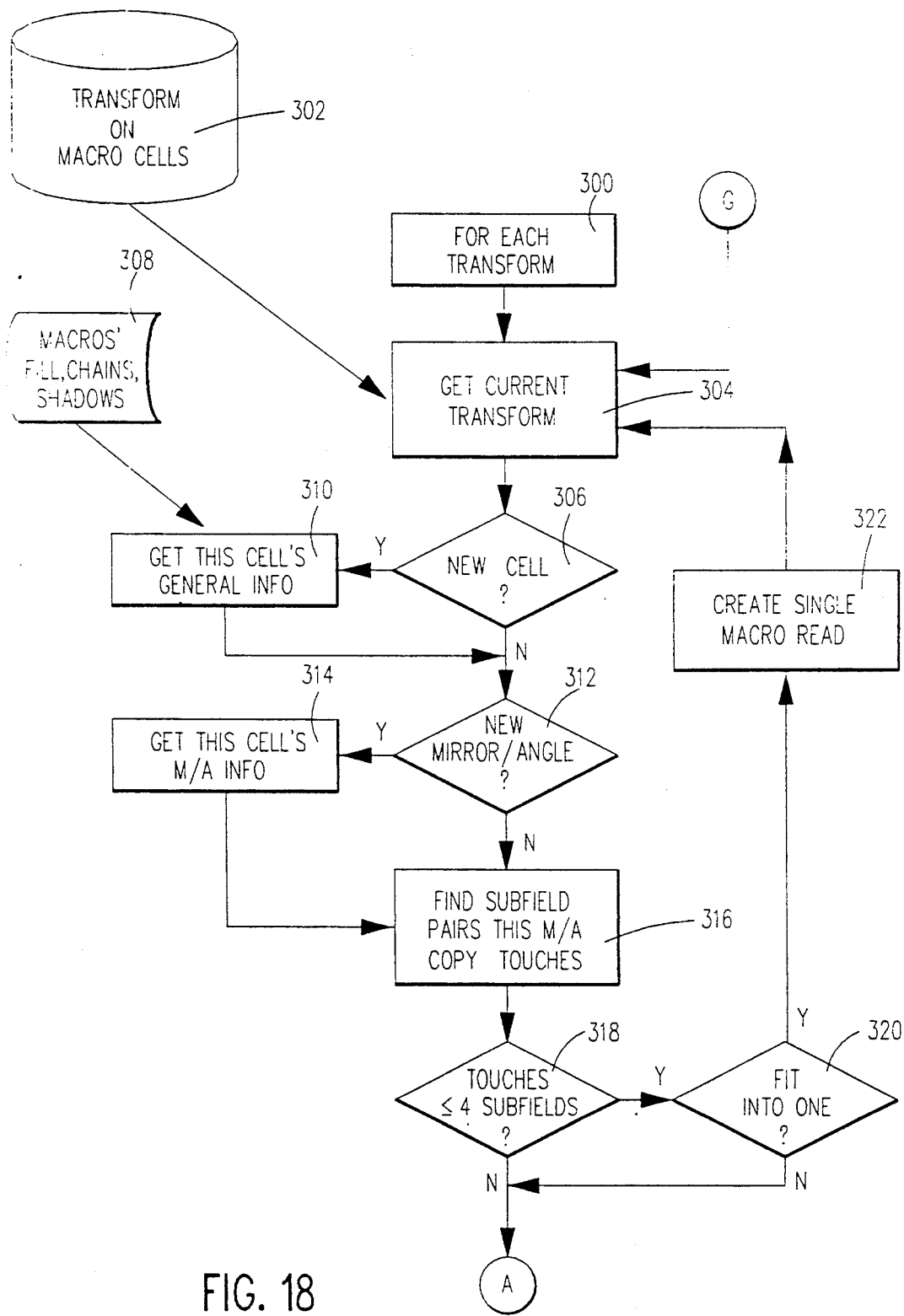
FIGS. 18-21 are a flow diagram for the macro placement and greying step of the preferred embodiment of the present invention.
Figure 19:
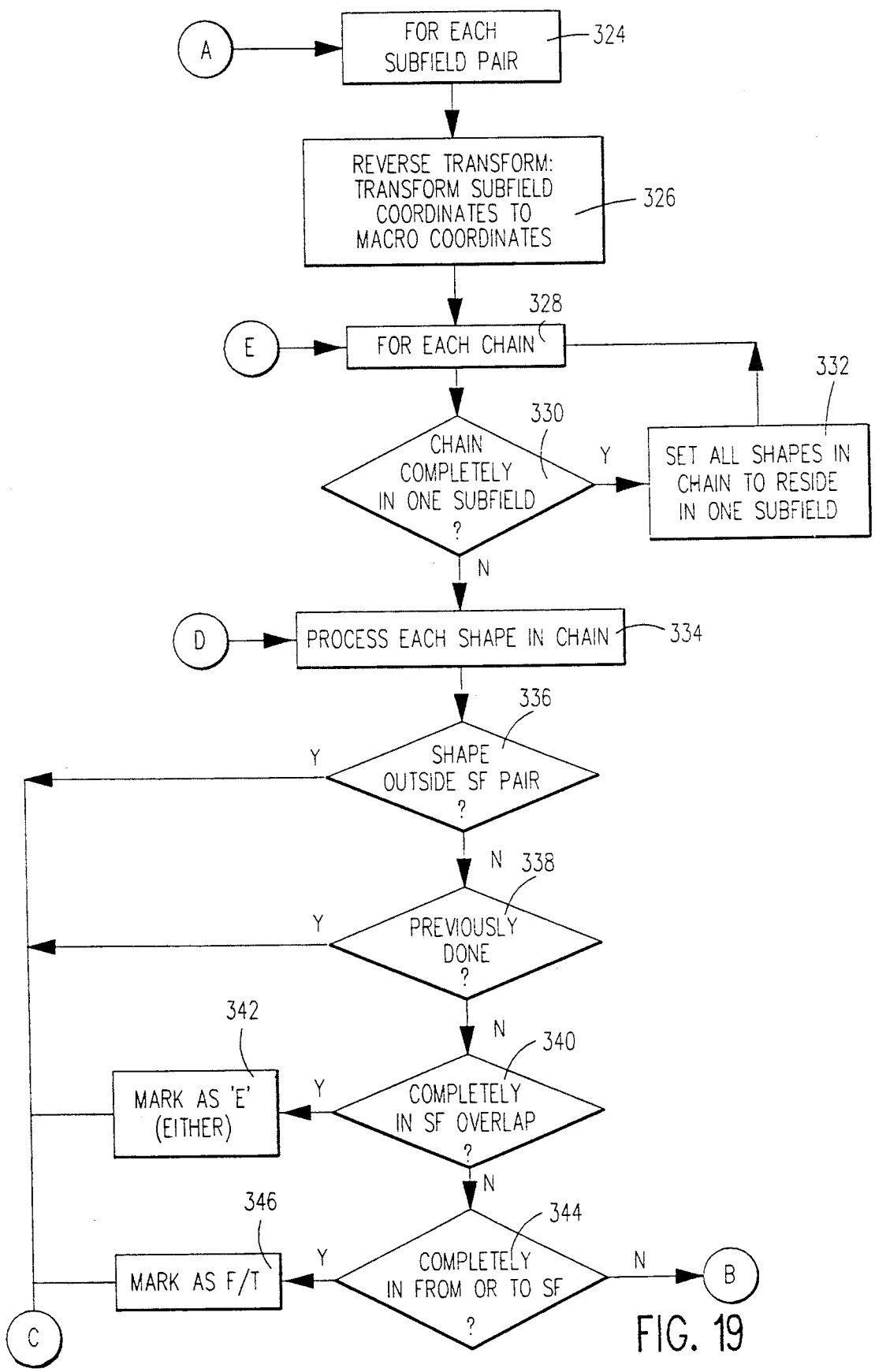

For example, FIG. 17A is a representation of a group of 6 subfields 250 labeled A, B, C, D, E, and F respectively. Macro 252 was transformed twice, T1 and T2 into the six subfields. In the Macro Organization Step, the Macro fill rectangles were sorted and chained. Fill rectangle labeling indicates the sort order. The chains created were R1:R2, R3:R4, R5:R7, and R6:R8. Shadows were created for each chain and for the Macro. The Macro shadow is labeled 254. Chain shadows created for the chains are 256, 258, 260, and 262 respectively.

FIGS. 18-21 provide a flow diagram of the macro placement and graying step of the preferred embodiment. This second major step, Macro Placement and Graying is done on each macro transform 300. So, the macro transforms, T1 and T2, are retrieved from a list of all macro transforms for the design which have been maintained in a buffer called the transform buffer 302. A macro's transforms are placed and grayed sequentially. However, the order in which the transforms are placed and grayed is unimportant. As each transform is retrieved from the transform buffer 302 to be placed and grayed (hereinafter processed), whenever a transform for a different macro is retrieved 306, the Macro Organization step must be done 308 to prepare the macro for processing. So, the macro's chain lists, chain shadows, and macro's shadow are passed from the Macro Oganization step 308 to the Placement and Graying step 310. The macro NC data from Macro Organization 308 is unmirrored and unrotated. It is very likely, that for each macro, less than all eight of the above described possible mirror and rotation combinations will be used in a design. Indeed, it is more likely that the number of combinations will be 2, 3 or even 1. Therefore, as each transform is processed, a check 312 is done to determine if that transform is mirrored and rotated like a previously processed transform, or if it has a new (unprocessed) mirror and rotation combination. New mirroring and rotation information must be applied to the macro's shadow 314 in order to transform the macro into the subfield's coordinates. After the mirror and rotation information is applied to the macro shadow, the macro shadow is placed at the macro transform's subfield coordinates to identify any subfield pairs 316 which the macro transform touches. If the transformed macro shadow touches less than 4 subfields 318, a check is made to determine if the shadow is completely within only one subfield 320 and, therefore, does not require graying. If the macro doesn't require graying, then a single macro read command is placed in the pattern buffer 322 and the next macro transform is processed 304. However, if the transformed macro shadow touches 2 or more subfields, more processing must be done.

If the macro shadow touches 2 or more subfields, then an assignment table is created for the transform. The assignment table has an entry for every macro fill rectangle in each subfield pair. All of the entries are initially set to N for neither, indicating that the corresponding rectangle has not been assigned to a subfield pair. Both T1 and T2 in FIG. 17A touch 4 subfields. FIG. 17B is a representation of the assignment table for transform T1 in FIG. 17A. T1 touches 4 subfield pairs, A/C, B/D, A/B and C/D. The assignment table for T1 has a row for each subfield pair and a column for each fill rectangle. Each entry in T1's assignment table was initialized to N.

After creating and initializing an assignment table, each subfield pair touching the macro shadow 324 is reverse transformed into macro coordinates 326. The location of the chain shadow for each macro shape 328 is checked to determine if the shape lies completely in one subfield and, so, requires no graying. If it is determined that the chain completely lies in one subfield 330, then all of the shapes in that chain are set to reside in that subfield 332.

If instead of lying completely in one subfield 330, the shadow intersects at least one subfield boundary, then the chain lies in more than one subfield and requires graying. If the chain requires graying, then each fill rectangle must be processed 334 by either assigning it to a subfield or gray-splicing only that fill rectangle and storing the gray-spliced rectangle in the pattern buffer. Each fill rectangle is assigned to a subfield by determining the rectangle's location in the subfield pair. As noted above the two subfields of a subfield pair are designated as the "From" and "To" subfields. To lie in a subfield, a fill rectangle must lie completely in the subfield (which includes the subfield's overlap into other subfields). So, a fill rectangle which lies completely in one of the subfields in a subfield pair lies in either the "From" or "To" subfield. Alternatively, a fill rectangle which touches, but does not lie completely in either of the subfields in the pair lies in neither subfield. A fill rectangle which lies completely in the overlap of the two subfields, lies in either subfield. Finally, some fill rectangles completely lie in the subfield pair but do not lie completely in one subfield and are, therefore, spanning rectangles which must be gray-spliced.

All of the fill rectangles in one subfield pair are processed 334 before any fill rectangles are processed in another subsequent (in the assignment table) subfield pair. In processing the fill rectangles, the shape is first checked 336 to determine if it lies outside of the subfield pair. If the shape is outside of the subfield pair 336, then the corresponding entry in the assignment table is not changed. If the rectangle is in the subfield pair, then, first the assignment table entry for the rectangle in the subfield pair is checked to determine if the rectangle was assigned to a subfield or gray-spliced when the rectangles in a previous subfield pair 338 were processed. If the rectangle was previously assigned to a subfield pair, then the entry in the assignment table is not changed. If the checks reveal that the rectangle completely lies in the subfield pair and was not previously assigned to to a subfield pair, then the rectangle: Lies in the "From" subfield; Lies in the "To" subfield; Lies in either subfield (because it is entirely in the overlap); or, Is a spanning rectangle which must be gray-spliced. So, first the rectangle is checked to determine if it lies entirely in the subfield overlap 340. If the rectangle lies in the subfield overlap, then the assignment table entry for the rectangle for the current subfield pair is marked E 342. If the rectangle does not completely lie in the subfield overlap, then the rectangle is checked to determine if it lies completely in the "From" or "To" subfield 344. If the rectangle lies completely in one subfield, then an appropriate entry is made in the assignment table 346 for the rectangle. The entry 346 is either F indicating that the rectangle lies in the "From" subfield or T indicating that the rectangle lies in the "To" subfield.

Figure 20:
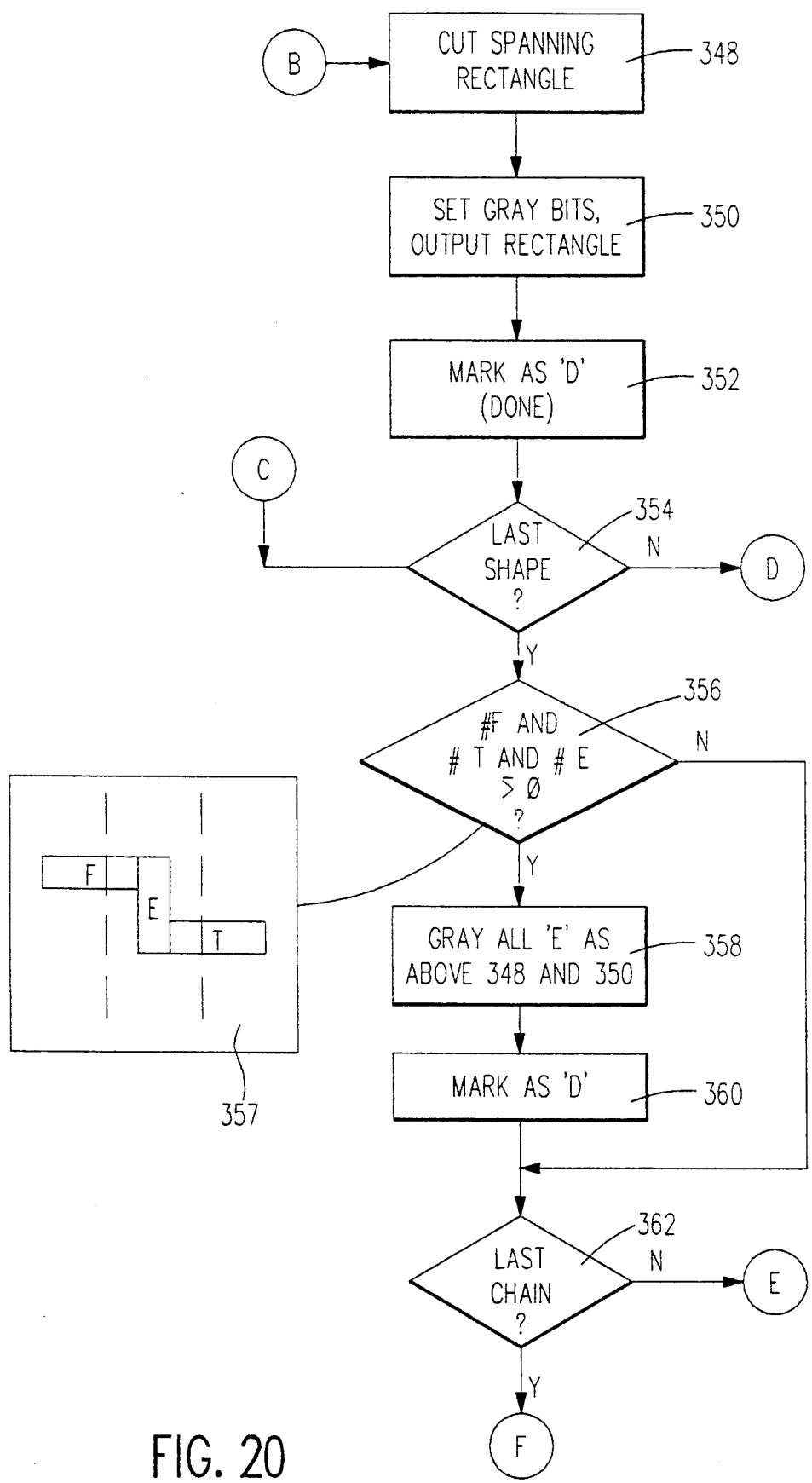
Figure 21:
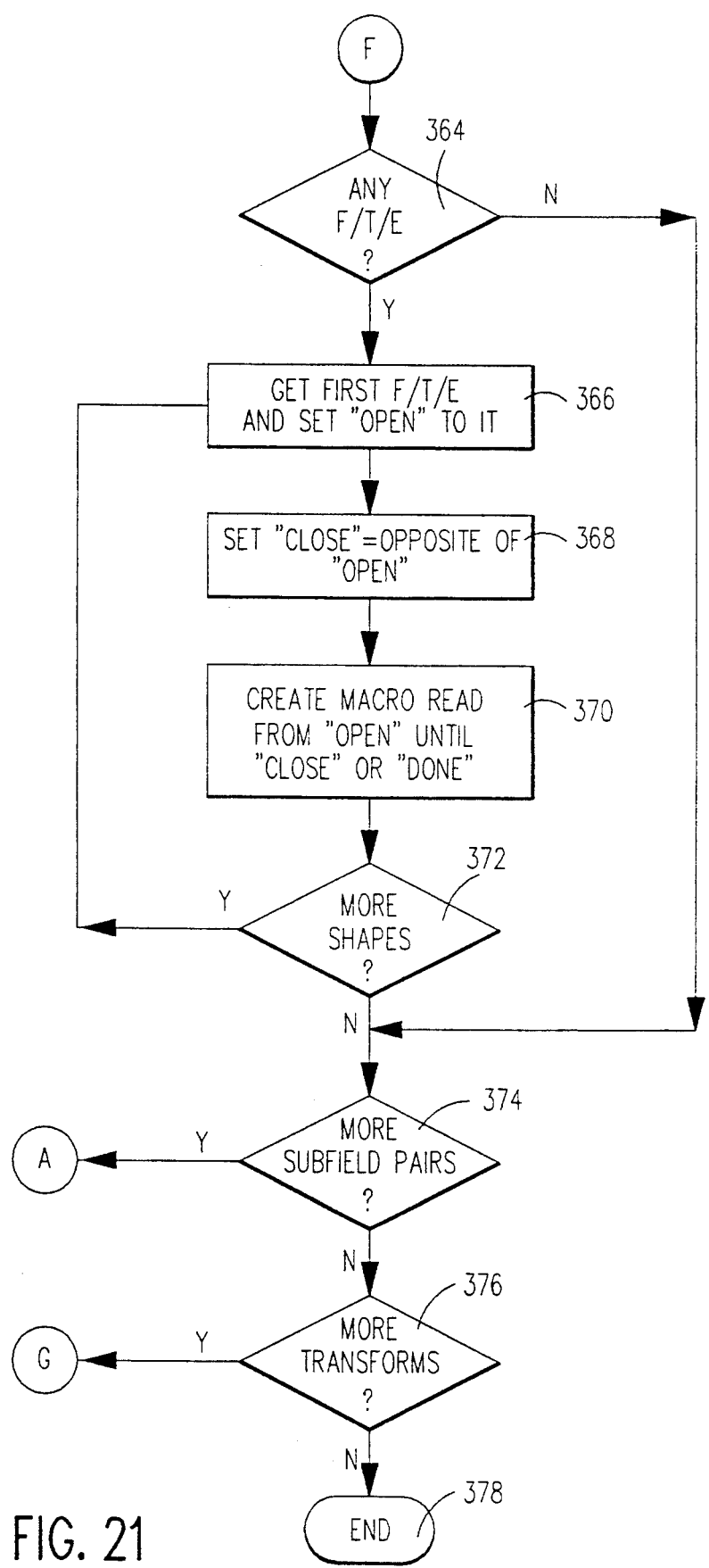

If the rectangle is not marked E 342, F or T 346, then the rectangle spans the boundary and is cut 348 in FIG. 20. The spanning rectangle is cut 348 for graying-splicing and gray bits are set in the NC data for the rectangle to tell the e-beam tool that graying is done on this rectangle. Then only the two cut portions of the grayed rectangle are output to the pattern buffer 350. Next, the assignment table entry for the grayed rectangle is replaced with a D 352 to indicate that rectangle processing is done for that rectangle. As each rectangle is marked 342, 346, or 352 or, when it is determined that the rectangle is outside of the subfield pair 336, or previously done 338, the rectangle is checked 354 to determine if it is the last rectangle in the chain in the subfield pair to be processed, i.e., all rectangles in the chain have been marked D, F, T, or E or intentionally left unaltered. If all of the rectangles in the chain have not been processed, then the next rectangle in the chain is processed 334.

When the last rectangle in the chain is processed 354, then a check is made to determine if a portion of the chain or a subchain spans 356 the subfield boundary. Since all spanning rectangles were gray-spliced 348, 350, and 352, spanning subchains 357 exist only for an F marked rectangle being connected to a T marked rectangle by an E marked rectangle. If any spanning subchains are found 356 then the E marked rectangles in the spanning subchains are grayed 358 as if they were spanning rectangles, i.e., the E rectangles are cut as in 348 and gray bits are set and placed in the pattern buffer as in 350. As each E rectangle is cut and grayed 358, the rectangle's assignment table entry is changed by replacing the E with a D, to mark the rectangle as done 360. Any E rectangle which is not part of a spanning subchain, is left ungrayed and marked as E.

After spanning rectangles and subchains have been grayed for the current chain a check is made to determine if the current chain is the last macro chain 362. If the current chain is not the last chain 362, then the next macro chain is processed, 328 in FIG. 19.

Once the last chain has been processed for the current subfield pair, i.e. the current chain is the last macro chain 362, the assignment table entries for the current subfield pair are checked to determine if any rectangles marked F, T, or E remain 364 (haven't been grayed and marked D). If the assignment table contains any entries marked F, T, or E for the current subfield pair 364, then macro read commands must be generated for the part of the macro containing the ungrayed rectangles in the subfield pair. These macro read commands are generated by setting a variable, "Open", to F, T or E, 366, and setting a second variable, "Close", to the value opposite that to which "Open" was set 368, e.g., if "Open"=F then "Close"=T. In the preferred embodiment E (either) marked rectangles are treated as F (From) marked rectangles for the purpose of creating a macro read 370. Then a macro read command is generated from the assignment table starting at each "Open" and sequentially adding rectangles until either a "Close" or D (done) is encountered 370. A macro read command is not created, for a single fill rectangle because doing so would increase data volume rather than reduce it. Instead, single or lone fill rectangles are placed in the pattern buffer ungrayed and marked as done in the assignment table. As each macro read command is created, shapes marked T, F and E used in creating the macro read command are marked in the assignment table with D as done.

Steps 366, 368, and 370 are repeated creating macro read commands for every group of fill rectangles until all of the marked shapes are either placed in the pattern buffer or included in a macro read command 372. FIGS. 17B, 17C and 17D show the assignment table for macro transform T1 in FIG. 17B as the fill rectangles in each subfield pair are processed 328. FIG. 17B shows the initialized assignment table with all entries set to N. FIG. 17C shows the state of the assignment table after processing the rectangles in T1. When the fill rectangles in subfield pair A/C were processed R1 and R2 were both marked F, indicating that they both completely lie in subfield A. R5 and R7 were both marked T indicating that they both lie in subfield C. Since R3, R4, R6 and R8 lie outside of pair A/C, their entries were left unchanged. A macro read command was created for R1 and R2 and they were marked D. R5 and R7 which are single unchained rectangles, were placed in the pattern buffer as unnested fill rectangles and marked D. When subfield pair B/D was processed, R3 and R4 were marked F, designating them to reside in subfield B, while R6 and R8 were marked T for subfield D. A macro read command was created for R3 and R4 and they were marked D. R6 and R8 were also placed in the pattern buffer as unnested single rectangles and marked D. Since all of the chains were processed when these first 2 subfield pairs were processed, processing was complete for T1 and the next transform could be processed. FIG. 17D is the state of the assignment table for Transform T2 after processing T2.

After all of the marked shapes have been placed in the pattern buffer or included in a macro read command, if the assignment table still has rectangles marked with N's, then there are more subfield pairs 374 which may require graying on the current transform of the macro. So, graying continues for the next subfield pair, 314 in FIG. 19. However, if all of the assignment table entries are marked D for done, then a check is made to determine if there are any transforms which have not been processed 376. If there are unprocessed transforms, then the next unprocessed transforms is processed 304.

Alternatively, if all of the transforms have been processed, then the macro has been grayed along every subfield boundary. The grayed macro has not been unnested. Only gray-spliced rectangles and single rectangles have been unnested. Graying is complete for all macro transforms 378, while data compaction has been maintained and CPU time minimized.

While what is considered to be the preferred embodiment of the invention is herein described, variations and modifications thereof will occur to those skilled in the art. Therefore, it is intended that the appended claims shall be construed to include the preferred embodiment and all such variations and modifications in form and detail that fall within the spirit and scope of the invention.

I claim:

1. A system for selectively graying and placing a plurality of macro transforms comprising;
    organization means for organizing a macro, said organization means comprising:
    shadowing means for creating a macro shadow and for creating a shadow around a shape in said macro, and
    sorting means for sorting a plurality of fill rectangles, said fill rectangles defining said shape in said macro;
    placing means for placing said macro and for selecting a macro transform for graying; and
    graying means for graying said selected macro transform.

2. The system of claim 1 wherein said organization means further comprises chaining means for chaining said sorted fill rectangles.

3. The system of claim 1 wherein said placing means further comprises means for placing a plurality of portions of said macro.

4. The system of claim 3 wherein said placed macro portions remain nested in said macro.

5. The system of claim 3, wherein said placing means further comprises transforming means for transforming from a first coordinate system to a second coordinate system.

6. The system of claim 5 wherein the graying means comprises:
    means for selecting a spanning fill rectangle from said macro and for gray-splicing said spanning rectangle;
    means for selecting a spanning subchain of fill rectangles from said macro and for gray-splicing one said spanning subchain fill rectangle.

7. The system of claim 6 wherein the graying means further comprises means for identifying a first portion of said macro located in a first subfield of a subfield pair and a second portion of said macro located in a second subfield of said subfield pair.

8. The system of claim 1 wherein the organization means comprises:
sorting means for sorting a plurality of fill rectangles;
chaining means for chaining together said sorted fill rectangles; and
shadowing means for creating a macro shadow for said macro and for creating a chain shadow for said chain of fill rectangles.

9. A method of generating a plurality of two dimensional shapes comprising the steps of:
organizing a macro, said macro comprising a plurality of fill rectangles, said fill rectangles being organized;
transforming a subfield pair boundary onto said macro, said transformed boundary defining a plurality of macro portions;
retrieving a first said portion of said macro from a buffer;
generating a first portion of a cell from a part of a shape from said first portion of said macro; and
generating at least one unnested shape touching said part of said shape.

10. The method of claim 9 further comprising the steps of:
retrieving a second said portion of said macro from said macro buffer; and
generating a second partial macro read command from said second portion of said macro.

11. The method of claim 9 further comprising the step of gray-splicing said at least one unnested shape.

12. The method of claim 11 further comprising identifying a first group of fill rectangles in one of said subfields and identifying a second group of fill rectangles in the other of said subfields.

13. The method of claim 12 wherein the first macro portion is said first group and the second macro portion is said second group.

14. A method of graying a macro comprised of a plurality of fill rectangles comprising the steps of:
a) organizing one said macro for graying, said organizing comprising:
creating at least one contiguous chain of said fill rectangles,
creating a chain shadow for each said at lest chain, and
creating a macro shadow for said macro; and
b) graying said organized macro and, placing a first and second portion of said grayed macro.

15. The method of claim 14 wherein at least one said fill rectangle spans a boundary of a pair of subfields.

16. The method of claim 15 wherein the organization step further comprises sorting said macro fill rectangles.

17. The method of claim 16 wherein said macro is two dimensional and said fill rectangles are sorted in an order determined by said macro's dimensions.

18. The method of claim 16 wherein said macro fill rectangles are sorted in an order determined by minimize cutting of said chains by said subfield pairs.

19. The method of claim 16 wherein each said at least one chain's shadow is the least enclosing rectangle for said at least one chain.

20. The method of claim 16 wherein said macro shadow is the least enclosing rectangle for said macro.

21. The method of claim 16 wherein the graying and placing step (b) further comprises gray-splicing at least one spanning fill rectangle and placing said gray-spliced fill rectangle.

22. The method of claim 21 wherein the graying and placing step (b) further comprises:
transforming said macro shadow into said subfield pair; and,
determining if said transformed macro is a spanning macro.

23. The method of claim 21 wherein the graying and placing step (b) further comprises:
transforming said subfield pair onto said macro; and,
determining which of said fill rectangles spans said subfield boundary.

24. The method of claim 23 wherein the graying and placing step (b) further comprises;
determining if each said chain intersects with said transformed subfield pair's boundary.

25. The method of claim 24 wherein the graying and placing step further comprises:
placing in one subfield of said subfield pair a first partial macro read command for any said chain completely located in said one subfield;
placing in a second subfield of said subfield pair a second partial macro read command for any said chain completely located in said second subfield;
said first portion of said grayed macro comprising said first partial macro read command; and,
said second portion of said grayed macro comprising said second partial macro read command.

26. The method of claim 25 wherein the graying and placing step comprises:
placing in one subfield of said subfield pair, a first partial macro read command for a first chain portion of at least one said determined intersecting chain, said first chain portion lying completely within said one subfield and butting one said gray-spliced and placed rectangle;
placing in a second subfield of said subfield pair a second partial macro read command for a second chain portion of said at least one determined intersecting chain, said second chain portion lying completely within said second subfield and butting said one gray-spliced and placed rectangle;
said first portion of said grayed macro further comprising said first partial macro read command; and,
said second portion of said grayed macro further comprising said second partial macro read command.

27. A method of generating control for controlling a particle beam tool in exposing a radiation sensitive layer to at least one repetitious shape, said repetitious shape being described by a two dimensional macro, said macro comprising a plurality of fill rectangles, said method comprising the steps of;
a) organizing said macro, said organizing step comprising the steps of:
1) sorting a plurality of fill rectangles in said macro according to the macro's largest dimension, and
2) creating at least one chain of rectangles from said sorted fill rectangles, a chain shadow for each said at least one chain, and a macro shadow for said macro; and,
b) placing said macro for each occurrence of said repetitious shape and for each occurrence of said repetitious shape spanning a boundary of a subfield pair graying said macro along said boundary, said placing and graying step comprising the steps of:

1) transforming said macro shadow onto each said occurrence of said repetitious shape in said subfield pair until said macro shadow spans said boundary,
2) transforming said boundary onto said macro,
3) determining which of said fill rectangles lie in each of said pair of subfields,
4) determining which of said fill rectangles span said subfield boundary,
5) determining which of said fill rectangles form subchains spanning subfield boundaries,
6) gray-splicing and placing said spanning rectangles and said subchain fill rectangles lying in an overlap region,
7) placing in one said subfield all said fill rectangles completely lying in said subfield and placing in the other said subfield all of said fill rectangles completely lying in said other subfield,
8) repeating steps 2–7 for a second subfield pair boundary if at least one said fill rectangle remains unplaced, and
9) repeating steps 1–8 until said macro has been transformed onto every said repetitious shape occurrence.

* * * * *